(12) United States Patent
Wang et al.

(10) Patent No.: US 12,100,680 B2
(45) Date of Patent: Sep. 24, 2024

(54) SEMICONDUCTOR STRUCTURE AND METHOD FOR PREPARING SAME

(71) Applicant: CHANGXIN MEMORY TECHNOLOGIES, INC., Hefei (CN)

(72) Inventors: Luguang Wang, Hefei (CN); Jinrong Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 289 days.

(21) Appl. No.: 17/846,125

(22) Filed: Jun. 22, 2022

(65) Prior Publication Data

US 2023/0238346 A1 Jul. 27, 2023

Related U.S. Application Data

(63) Continuation of application No. PCT/CN2022/078108, filed on Feb. 25, 2022.

(30) Foreign Application Priority Data

Jan. 12, 2022 (CN) .......................... 202210032642.4

(51) Int. Cl.
*H01L 23/00* (2006.01)
(52) U.S. Cl.
CPC .............. *H01L 24/16* (2013.01); *H01L 24/05* (2013.01); *H01L 24/13* (2013.01); *H01L 24/81* (2013.01);

(Continued)

(58) Field of Classification Search
CPC ......... H01L 24/16; H01L 24/05; H01L 24/03; H01L 24/11; H01L 24/13; H01L 24/80;
(Continued)

(56) References Cited

U.S. PATENT DOCUMENTS 10,319,693 B2 6/2019 Lambert
2006/0121690 A1 6/2006 Pogge et al.
(Continued)

FOREIGN PATENT DOCUMENTS

CN 1708840 A 12/2005
CN 105097777 A 11/2015
(Continued)

*Primary Examiner* — Marcos D. Pizarro
*Assistant Examiner* — Tiberiu Dan Onuta
(74) *Attorney, Agent, or Firm* — Kilpatrick Townsend & Stockton LLP

(57) ABSTRACT

A semiconductor structure includes: a first base having a first face, a second base having a second face and a welded structure. The first base is provided with an electrical connection column protruding from the first face. A conductive column is provided in the second base, and a first groove and a second groove are further provided at the second face. The first groove is located above the conductive column, and the second groove exposes at least part of a side surface of the conductive column. The protruding portion of the electrical connection column is located in the second groove, and part of a side surface of the electrical connection column and part of the side surface of the conductive column overlap in staggered way in a direction perpendicular to the first face or the second surface. At least part of the welded structure is filled in the first groove.

17 Claims, 13 Drawing Sheets

(52) U.S. Cl.
CPC ............... *H01L 2224/05611* (2013.01); *H01L 2224/05639* (2013.01); *H01L 2224/13083* (2013.01); *H01L 2224/13124* (2013.01); *H01L 2224/13147* (2013.01); *H01L 2224/13166* (2013.01); *H01L 2224/13181* (2013.01); *H01L 2224/16147* (2013.01); *H01L 2224/81895* (2013.01); *H01L 2924/04941* (2013.01); *H01L 2924/04953* (2013.01)

(58) Field of Classification Search
CPC ........... H01L 24/81; H01L 2224/05611; H01L 2224/05082; H01L 2224/05147; H01L 2224/05582; H01L 2224/05639; H01L 2224/13083; H01L 2224/13124; H01L 2224/13147; H01L 2224/13166; H01L 2224/13181; H01L 2224/16147; H01L 2224/81895; H01L 2224/80801; H01L 2224/80948; H01L 2224/16148; H01L 2224/10126; H01L 2924/04941; H01L 2924/04953; H01L 23/482; H01L 21/50
See application file for complete search history.

(56) References Cited

U.S. PATENT DOCUMENTS

| | | | |
|---|---|---|---|
| 2012/0012997 A1* | 1/2012 | Shen | H01L 23/49816 257/E21.507 |
| 2013/0292823 A1 | 11/2013 | Chapelon | |
| 2015/0054140 A1 | 2/2015 | Chapelon | |
| 2015/0287687 A1 | 10/2015 | Farrens et al. | |
| 2015/0364441 A1 | 12/2015 | Lambert | |
| 2017/0011948 A1 | 1/2017 | Farrens et al. | |
| 2017/0186724 A1 | 6/2017 | Chylak et al. | |
| 2017/0194283 A1* | 7/2017 | Dubey | H01L 24/06 |
| 2020/0243467 A1 | 7/2020 | Prevatte et al. | |
| 2020/0251641 A1* | 8/2020 | Zhai | H01L 33/62 |
| 2021/0217703 A1 | 7/2021 | Chuang et al. | |
| 2021/0398929 A1* | 12/2021 | Kim | H01L 23/3157 |
| 2022/0189822 A1 | 6/2022 | Wang et al. | |

FOREIGN PATENT DOCUMENTS

| | | |
|---|---|---|
| CN | 108573883 A | 9/2018 |
| CN | 111081646 A | 4/2020 |
| CN | 111199946 A | 5/2020 |
| CN | 111326503 A | 6/2020 |
| CN | 111785646 A | 10/2020 |
| CN | 112117249 A | 12/2020 |
| CN | 112456436 A | 3/2021 |
| CN | 112614807 A | 4/2021 |
| CN | 112670191 A | 4/2021 |
| CN | 112670249 A | 4/2021 |
| CN | 112802757 A | 5/2021 |
| JP | 2014143305 A | 8/2014 |

\* cited by examiner

SEMICONDUCTOR STRUCTURE AND METHOD FOR PREPARING SAME

CROSS-REFERENCE TO RELATED APPLICATIONS

This application is a U.S. continuation application of International Application No. PCT/CN2022/078108, filed Feb. 25, 2022, which claims priority to Chinese Patent Application No. 202210032642.4, filed Jan. 12, 2022. International Application No. PCT/CN2022/078108 and Chinese Patent Application No. 202210032642.4 are incorporated herein by reference in their entireties.

BACKGROUND

With the development of 3D packaging technology, multi-layer stack packaging technology is widely used, but the multi-layer stacked structure needs wafers with a same size to stack. The connection structure between wafers will occupy a certain thickness of the multi-layer stacked structure, which will increase the overall thickness of the multi-layer stack structure, and thus cannot meet the need of thinner and thinner terminals.

In addition, with the continuous miniaturization of integration, the size of connection structures in the multilayer stacked structure is getting smaller and smaller, and the distance between adjacent connection structures is getting smaller and smaller, which easily leads to short circuit between adjacent connection structures and wafer-to-wafer shedding.

SUMMARY

The embodiments of the disclosure relate to the semiconductor field, and in particular to a semiconductor structure and a method for preparing the same.

According to some embodiments of the disclosure, one aspect of the embodiments of the disclosure provides a semiconductor structure including: a first base having a first face, a second base having a second face and a welded structure. The first base is provided with an electrical connection column protruding from the first face. A conductive column is provided in the second base. A first groove and a second groove are further provided at the second face. The first groove communicates with the second groove. The first groove is located above the conductive column and exposes at least a part of a top surface of the conductive column, and the second groove exposes at least a part of a side surface of the conductive column. The second face is bonded to the first face. The protruding portion of the electrical connection column is located in the second groove, and a part of a side surface of the electrical connection column and a part of the conductive column overlap in a staggered way in a direction perpendicular to the first face or the second face. At least a part of the welded structure is filled in the first groove, and at least a further part of the welded structure is located between the electrical connection column and a bottom surface of the second groove.

According to some embodiments of the disclosure, another aspect of the embodiments of the disclosure also provides a method for preparing a semiconductor structure, including the following operations. A first base having a first face is provided. The first base is provided with an electrical connection column protruding from the first face. A second base having a second face is provided. A conductive column is provided in the second base. A first groove and a second groove are further provided at the second face. The first groove communicates with the second groove. The first groove is located above the conductive column and exposes at least a part of a top surface of the conductive column, and the second groove exposes at least a part of a side surface of the conductive column. The second face is bonded to the first face. The protruding portion of the electrical connection column is located in the second groove, and a part of a side surface of the electrical connection column and a part of the side surface of the conductive column overlaps in a staggered way in a direction perpendicular to the first face or the second face. At least a part of the welded structure is filled in the first groove, and at least a further part of the welded structure is also located between the electrical connection column and a bottom surface of the second groove.

BRIEF DESCRIPTION OF THE DRAWINGS

One or more embodiments are illustrated by the pictures in the drawings corresponding thereto. These exemplary descriptions do not constitute a limitation on the embodiments. Unless otherwise stated, the figures in the drawings do not constitute a scale limitation.

DETAILED DESCRIPTION

Figure 1:
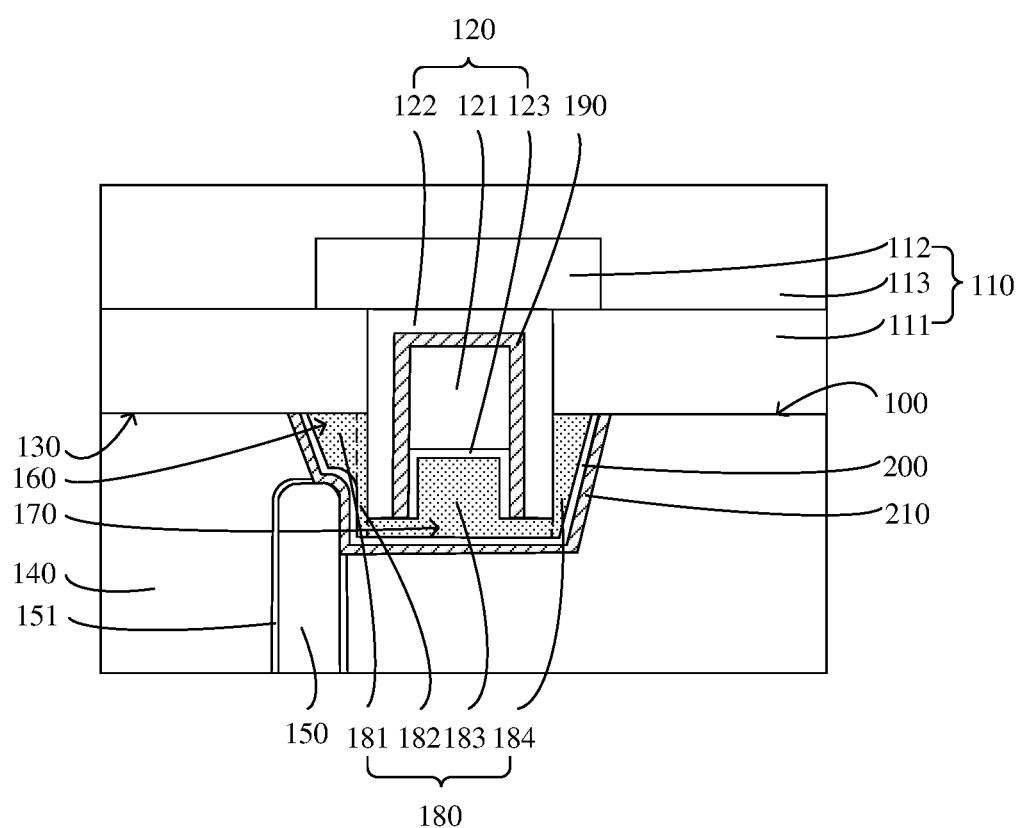
FIG. 1 is a schematic structural diagram of a semiconductor structure provided by an embodiment of the disclosure.

It can be seen from the background that with the continuous miniaturization of the integration, a size of a connection structure in a multi-layer stacked structure becomes smaller and smaller, and the spacing between adjacent connection structures becomes smaller and smaller. However, the small spacing between the connection structures may lead to lapping between the adjacent connection structures, and further lead to short circuit between the adjacent connection structures.

By analysis, it is found that a TCB-NCF thermo-compression bonding process is usually used in the current packaging technology of stacked bases. The TCB (Thermo Compression Bonding) uses heating and pressurizing to form welding at the connection structure between two adjacent bases so as to realize the connection between the adjacent bases. The NCF (Non Conduction Adhesive Film) works in cooperation with the TCB process. That is, NCF is coated between two bases, and NCF is used as a filling material to fill in the gap between the two bases and wrap the connection structures protruding from the bases.

However, due to the special fluidity of NCF material, it is impossible to give a manufacturing process with an enough strength to the connection structure. The shape of the connection structure is easy to shift under force, which makes the connection between adjacent bases unstable. Moreover, the shape of the connection structure is easy to shift under force, making readily the shape of the connection structure abnormal, which may lead to a dislocation at the joint between bases, thereby reducing the signal transmission efficiency between adjacent bases, and may also lead to short circuit due to contacting between adjacent connection structures. In addition, due to the addition of NCF materials between the bases, an overall thickness of the stacked bases is increased, which is not suitable for the current demand that the terminals are getting thinner and thinner.

The embodiments of the disclosure provide a semiconductor structure in which a bonding between a first base and a second base can be tightened and the height of the whole semiconductor structure can be reduced by arranging a protruding portion of an electrical connection column in a second groove. By arranging a welded structure in a first groove and the second groove, the flow of the welded structure in the bonding process, which leads to the interconnection of adjacent electrical connection columns or conductive columns, can be avoided. The reliability of the semiconductor structure can also be improved by arranging the welded structure in the first groove and the second groove. Moreover, by reducing the use of the NCF material, the material consumption can be reduced and the height of the entire semiconductor structure can be reduced, and the occurrence of a short circuit caused by contact of adjacent connection structures due to the use of the NCF material can also be avoided.

The embodiments of the disclosure will be described in detail below with reference to the accompanying drawings. However one of ordinary skill in the art will appreciate that numerous technical details are set forth in the various embodiments of the disclosure in order to enable the reader to better understand the embodiments of the disclosure. However, even without these technical details and various changes and modifications based on the following embodiments, the technical solutions claimed by the embodiments in this disclosure can be realized.

FIG. 1 is a schematic structural diagram of a semiconductor structure provided by an embodiment of the disclosure.

Referring to FIG. 1 the semiconductor structure includes a first base 110 having a first face 100, a second base 140 having a second face 130 and a welded structure 180. The first base 110 is provided with an electrical connection column 120 protruding from the first face 100. A conductive column 150 is provided in the second base 140. A first groove 160 and a second groove 170 are further provided at the second face 130. The first groove 160 communicates with the second groove 170. The first groove 160 is located above the conductive column 150 and exposes at least part of a top surface of the conductive column 150. The second groove 170 exposes at least part of a side surface of the conductive column 150. The second face 130 is bonded to the first face 100. The protruding portion of the electrical connection column 120 is located in the second groove 170, and a part of the side surface of the electrical connection column 120 and a part of the side surface of the conductive column 150 overlap in a staggered way in a direction perpendicular to the first face 100 or the second face 130. At least a part of the welded structure 180 is filled in the first groove 160, and at least a further part of the welded structure 180 is located between the electrical connection column 120 and the bottom surface of the second groove 170.

In some embodiments, the first base 110 and the second base 140 may both be a wafer, and the semiconductor structure may be a wafer-stacked structure. In other embodiments, the first base 110 and the second base 140 may also both be a die, and the semiconductor structure may be a die-stacked structure. Further, in yet other embodiments, one of the first base 110 and the second base 140 may be a wafer, and the other may be a die.

Specifically, in some embodiments, the first base 110 may include a passivation layer 111, a conductive layer 112 and a substrate 113.

In some embodiments, the passivation layer 111 covers the surface of the substrate 113 facing the passivation layer 111, and the passivation layer 111 also covers part of the surface of the conductive layer 112. The passivation layer 111 is configured to protect the conductive layer 112 and the substrate 113, preventing the conductive layer 112 and the substrate 113 from contacting other structures, thereby improving the stability of the semiconductor structure. The conductive layer 112 is located in the substrate 113, and the substrate 113 exposes the surface of the conductive layer 112. The conductive layer 112 is configured to electrically connect the electrical connection column 120 with other structures in the first base 110.

In some embodiments, the material of passivation layer 111 may be an insulating material with a high relative dielectric constant such as silicon nitride, silicon nitride or silicon oxynitride. The material of conductive layer 112 may be a conductive material such as aluminum, silver or gold. The material type of the substrate 113 may be an elemental semiconductor material or a crystalline inorganic compound semiconductor material. The elemental semiconductor material may be silicon or germanium, and the crystalline inorganic compound semiconductor material can be silicon carbide, silicon germanium, gallium arsenide, indium gallium and the like.

In some embodiments, the electrical connection column 120 is located on the surface of the conductive layer 112 and electrically connected with conductive layer 112. The electrical signals of the conductive layer 112 are led out through the electrical connection column 120. In other embodiments, part of electrical connection column 120 may also be embedded in the conductive layer 112. In yet other embodiments, the electrical connection column may also penetrate the conductive layer and electrically connect with the conductive layer through the sidewalls of the electrical connection column.

The height of the semiconductor structure can be reduced by disposing the electrical connection column 120 in the second groove 170. The welded structure 180 can be confined by arranging the welded structure 180 in the first groove 160 and the second groove 170, so as to avoid the lap between adjacent electrical connection columns 120 or adjacent conductive columns 150 caused by the flow of the welded structure 180, thereby reducing the possibility of short circuit of the semiconductor structure. The connection between the first base 110 and the second base 140 can be tightened by filling the welded structure 180 around the electrical connection column 120, thereby improving the connection tightness of the semiconductor structure.

In some embodiments, the electrical connection column 120 may include a conductive body 121, a first diffusion barrier layer 122 located on the bottom and side surfaces of the conductive body 121, and a first metal protective layer 123 located on the top surface of the conductive body 121. The first metal protective layer 123 is located between the conductive body 121 and the welded structure 180, and a part of the conductive body 121 located in the second groove 170.

In some embodiments, the conductive body 121 may be configured to realize signal transmission between the first base 110 and the second base 140.

The first diffusion barrier layer 122 may be higher than the conductive body 121. The first diffusion barrier layer 122 may prevent partial ions of the copper metal in the conductive body 121 from entering the first base 110 during ion diffusion, preventing the conductive body 121 from contaminating the first base 110, thereby improving the performance of the entire semiconductor structure. The first metal protective layer 123 is located on the surface of the conductive body 121 facing the second groove 170, and the first metal protective layer 123 may also cover inner walls of a part of the first diffusion barrier layer 122 higher than the conductive body 121. The first metal protective layer 123 is configured to protect the conductive body 121 from contacting with air, preventing a part of the conductive body 121 from reacting with air, thereby preventing the part of the conductive body 121 from being oxidized. The conductive body 121 can be separated from air by the first metal protective layer 123, thereby avoiding oxidation or water vapor corrosion of the conductive body 121. The first metal protective layer 123 can also be configured to prevent the conductive body 121 from contaminating the second base 140 in the process of ion diffusion.

In some embodiments, the material of the conductive body 121 includes copper or aluminum, and the material of the first diffusion barrier layer 122 includes tantalum, titanium, titanium nitride or tantalum nitride.

It will be understood that the copper material and the aluminum material have a good electrical conductivity, and the price of the materials themselves is low, which is conducive to reducing the cost of semiconductor structure while ensuring a good electrical conductivity. As an example where the material of the first diffusion barrier layer 122 is titanium nitride, by forming a titanium nitride layer on the surface of the conductive body 121, the grain boundaries and various defects of a part of the conductive body 121 can be filled, thereby blocking a rapid diffusion path of atoms. In some embodiments, a laminated structure of a titanium nitride layer and a tantalum layer may be formed as the first diffusion barrier layer 122. The barrier characteristics of the first diffusion barrier layer 122 can be improved by the laminated structure of the titanium nitride layer and the tantalum layer.

In some embodiments, the first diffusion barrier layer 122 and the first metal protective layer 123 also have portions protruding from the top surface of the conductive body 121.

An accommodation space can be formed by the portions protruding from the top surface of the conductive body 121, thereby providing convenience for the processing technology of forming the semiconductor structure. That is, it is convenient for an initial welded structure to have a certain initial shape on the top surface of the first metal protective layer 123, so as to prevent from being present on the surface of the passivation layer 111 before bonding the first base 110 to the second base 140. Thus, it is avoided that excessive initial welding structure present on the surface of passivation layer 111 affects the surface attachment of the first face 100 to the second face 130. The total volume of the welded structure 180 can be indirectly controlled by forming the accommodation space. The lack of the welded structure 180 during bonding of the first base 110 to the second base 140 can be avoided by controlling the total volume of the welded structure 180. The stability of the connection between the first base 110 and the second base 140 can be improved by controlling the total volume of the welded structure 180. Moreover, by controlling the total volume of the welded structure 180, the welded structure 180 can be prevented from being too much due to a too large total volume of the welded structure 180. Otherwise, during bonding the first base 110 to the second base 140, a part of the welded structure 180 may overflow to electrically connect the part of the welded structure 180 to the electrical connection column 120 adjacent thereto, resulting in a poor effect of improving the problem of lapping between adjacent connection structures caused by a small spacing between the connection structures. By controlling the total volume of the welded structure 180, the stability in the production process can be improved, and the reliability of the semiconductor structure can also be improved.

In some embodiments, the semiconductor structure may further include a first electroplating seed layer 190 located between the conductive body 121 and the first diffusion barrier layer 122.

In some embodiments, a part of the first electroplating seed layer 190 may be higher than the surface of the conductive body 121, and the top surface of the first electroplating seed layer 190 may be flush with the top surface of the first diffusion barrier layer 122. In other embodiments, the top surface of the first electroplating seed layer 190 may also be flush with the top surface of the conductive body 121, and the corresponding height of the top surface of the first electroplating seed layer 190 can be selected based on requirements.

The material of the first electroplating seed layer 190 may be copper or aluminum, and the material of the first electroplating seed layer 190 may be the same as that of the conductive body 121. By forming the first electroplating seed layer 190, it can be facilitated that the formation of the conductive body 121 is guided. Also the adhesion between the conductive body 121 and the first diffusion barrier layer 122 can be improved by the first electroplating seed layer 190, thereby improving the stability of the connection between the conductive body 121 and the first diffusion barrier layer 122. Furthermore, the cavity defects in the conductive body 121 can be reduced by the first electroplating seed layer 190, thereby improving the effect of the first diffusion barrier layer 122 in preventing ion diffusion of the conductive body 121.

In some embodiments, the ratio of the depth of the first groove 160 to the depth of the second groove 170 in the direction perpendicular to the first face 100 is in a range of 1:1 to 1:10, for example, 1:3, 1:5, 1:8, etc.

It will be understood that the ratio of the depth of the first groove 160 to the depth of the second groove 170 can be adjusted based on actual needs. The sum of the depths of the first groove 160 and the second groove 170 should satisfy that the welded structure 180 needs to fill up the first groove 160 and the second groove 170 after bonding the first base 110 to the second base 140. On the premise that the welded structure 180 fills up the first groove 160 and the second groove, the deeper the second groove 170 is, the larger the contact area between the electrical connection column 120 and the conductive column 150 is accordingly, and the larger the contact area is, the better the heat dissipation effect of the semiconductor structure is. When the ratio of the depth of the first groove 160 to the depth of the second groove 170 is less than 1:10, it may occur that the welded structure 180 cannot fill up the entire first 160 and second 170 grooves, resulting in a low stability of the semiconductor structure.

In some embodiments, the welded structure 180 is also located between the electrical connection column 120 and the sidewalls of the second groove 170, and between the conductive column 150 and the electrical connection column 120.

It will be understood that, during bonding the first base 110 to the second base 140, the welded structure 180 is heated into a molten state. With the bonding of the first base 110 to the second base 140, the welding structure 180 is deformed. Specifically, the welded structure 180 can be divided into a first welded portion 181, a second welded portion 182, a third welded portion 183 and a fourth welded portion 184. The first welded portion 181 fills up the first groove 160. The second welded portion 182 is located between a sidewall of the second groove 170 adjoining the first groove 160 and a sidewall of the electrical connection column 120 facing the first groove 160. The third welded portion 183 is located between the bottom surface of the second groove 170 and the electrical connection column 120 The fourth welded portion 184 is located between a sidewall of the electrical connection column 120 away from the first groove 160 and a sidewall of the second groove 170 away from the first groove 160.

It is to be noted that, in the embodiments of the disclosure, the welded structure 180 is divided into the first welded portion 181, the second welded portion 182, the third welded portion 183 and the fourth welded portion 184, only for the convenience of describing the welded structure 180, and not limiting the welded structure 180. The first welded portion 181, the second welded portion 182, the third welded portion 183, and the fourth welded portion 184 communicate with each other. The first groove 160 and the second groove 170 are filled up by the welded structure 180 to realize the electrical connection between the electrical connection column 120 and the conductive column 150. Moreover, the tightness of the connection between the first base 110 and the second base 140 can be improved by the welded structure 180.

In some embodiments, the material of the welded structure 180 includes tin or tin-silver alloy or the like.

It can be understood that the tin or tin-silver alloy has a lower melting point and a higher condensation point, so that the welded structure 180 becomes liquid and changes from liquid to solid at a faster rate during bonding of the first base 110 to the second base 140, thereby shortening the time of the entire preparation process of the semiconductor structure. Tin or tin-silver alloy has a better affinity with metal such as copper, so that the welded structure 180 is better connected with the electrical connection column 120 and the conductive column 150, and thus the connection is tighter. Tin or tin-silver alloy also has a good electrical conductivity, which is convenient for electrical signal transmission between the electrical connection column 120 and the conductive column 150. Tin or tin-silver alloy has a good fluidity after heating, which is also convenient to bond the electrical connection column 120 to the conductive column 150.

In some embodiments, the semiconductor structure may further include a second diffusion barrier layer 200 located on the bottom surface and the sidewall of the first groove 160, and also on the bottom surface and the sidewall of the second groove 170, as well as also on the top surface of the conductive column 150 exposed by the first groove 160 and the side surface of the conductive column 150 exposed by the second groove 170. By providing the second diffusion barrier layer 200, partial ions in the material of the conductive column 150 can be prevented from entering into the first base 110 during ion diffusion, reducing the possibility of contamination of the first base 110, thereby improving the performance of the semiconductor structure. By providing the second diffusion barrier layer 200, the grain boundaries and various defects of a part of the conductive column 150 can be filled, thereby blocking the rapid diffusion path of atoms.

In some embodiments, the second diffusion barrier layer 200 may have the same material as the first diffusion barrier layer 122, such as tantalum, titanium, titanium nitride, or tantalum nitride, thereby reducing the types of materials for producing the semiconductor structure and thus facilitating the control of the entire production process.

In some embodiments, the semiconductor structure may further include a second electroplating seed layer 210, which is located between the second diffusion barrier layer 200 and the bottom surface and sidewall of the first groove 160, and also between the second diffusion barrier layer 200 and the bottom surface and the sidewall of the second groove 170, as well as also between the second diffusion barrier layer 200 and the top surface of the conductive column 150 exposed by the first groove 160, and between the second diffusion barrier layer 200 and the side surface of the conductive column 150 exposed by the second groove 170.

In some embodiments, by providing the second electroplating seed layer 210, the adhesion between the conductive column 150 and the second diffusion barrier layer 200 can be improved, thereby improving the stability of the connection between the conductive column 150 and the second diffusion barrier layer 200. Moreover, the effect of the second diffusion barrier layer 200 in preventing ion diffusion of the conductive column 150 can be improved by the laminated structure of the second electroplating seed layer 210 and the second diffusion barrier layer 200.

In some embodiments, the material of the second electroplating seed layer 210 may be the same as that of the first electroplating seed layer 190, and the material of the second electroplating seed layer 210 may also be the same as that of the conductive column 150.

In some embodiments, the semiconductor structure further includes a first protective layer 151 located between the conductive column 150 and the second base 140. The first protective layer 151 facilitates the protection of the conductive column 150. The impact force on the conductive column 150 when the semiconductor structure is impacted can be reduced by the first protective layer 151, thereby protecting the conductive column 150.

In some embodiments, the sum of the widths of the first groove 160 and the second groove 170 is 2 to 3 times the width of the conductive column 150, in the direction perpendicular to the extension direction of the conductive column 150. By setting the sum of the widths of the first groove 160 and the second groove 170 to be 2-3 times the width of the conductive column 150, it is advantageous to fill the unoccupied space in the first groove 160 and the second groove 170 by the conductive column 150 and the electrical connection column 120. It will be understood that the ratio of the widths of the first groove 160 and the second groove 170 to the width of the conductive column 150 can be accordingly adjusted based on the total volume of the conductive column 150 and the electrical connection column 120 to be accommodated in the first groove 160 and the second groove 170.

In the embodiments of the disclosure, the electrical connection columns 120 and the conductive columns 150 can be allowed to cooperate with each other by overlapping the electrical connection columns 120 and the conductive columns 150 in a staggered way, which is beneficial to avoid sliding between the first base 110 and the second base 140, and further improve the bonding stability between the first base 110 and the second base 140. By arranging the welded structure 180 in the first groove 160 and the second groove 170, the probability of short circuit of the semiconductor structure caused by the electrical connection of adjacent electrical connection columns 120 or adjacent conductive columns 150 due to the flow of the welded structures 180 can be reduced. The height of the entire semiconductor structure can be reduced by arranging the part of the electrical connection column 120 higher than the first base 110 in the second groove 170, and the electrical connection column 120 and the conductive column 150 can be overlapped in a staggered way, thereby improving the stability of bonding between the first base 110 and the second base 140. The contact area between the electrical connection column 120 and the conductive column 150 can be increased, by arranging the part of the electrical connection column 120 higher than the first base 110 in the second groove 170 and realizing the electrical connection between the electrical connection column 120 and the conductive column 150 by the welded structure 180, which is beneficial to reduce the contact resistance between the electrical connection column 120 and the conductive column 150 and also to improve the heat dissipation of the semiconductor structure. By arranging the part of the electrical connection columns 120 higher than the first base 110 in the second groove 170, the probability of short circuit of the semiconductor structure caused by the electrical connection of adjacent electrical connection columns 120 or adjacent conductive columns 150 can also be reduced, thereby improving the performance of the semiconductor structure.

Correspondingly, an embodiment of the disclosure also provides a method for preparing a semiconductor structure, which can be used for preparing the semiconductor structure mentioned above. The embodiment described in FIG. 1 can be referred to for the same or corresponding parts, which will not be described in detail below.

A semiconductor structure provided by another embodiment of the disclosure will be described in detail below with reference to the accompanying drawings. FIGS. 2 to 13 are schematic structural diagrams corresponding to each step of a method for preparing a semiconductor structure provided by an embodiment of the disclosure.

Referring to FIGS. 2 to 9, there is provided a first base 110 having a first face 100. The first base is provided with an electrical connection column 120 protruding from the first face 100.

In some embodiments, a method for forming the electrical connection column 120 includes the following operations. The first diffusion barrier layer 122 is formed. The conductive body 121 and the first metal protective layer 123 located on the top surface of the conductive body 121 are formed. The first metal protective layer 123 is also located between the conductive body 121 and the welded structure, and the first diffusion barrier layer 122 is located at least on the side surfaces and the bottom surface of the conductive body 121.

In some embodiments, the thickness of the first diffusion barrier layer 122 may be from 10 nm to 200 nm. It is understood that, when the thickness of the first diffusion barrier layer 122 is less than 10 nm, the effect of blocking the ion diffusion of the copper metal of the conductive body 121 is poor, and when the thickness of the first diffusion barrier layer 122 is higher than 200 nm, the resistance of the first diffusion barrier layer 122 may be too large, affecting the performance of the entire semiconductor structure.

The thickness of the first diffusion barrier layer 122 can be selected to be a corresponding thickness based on actual needs.

The first diffusion barrier layer 122 can prevent the first base 110 from being contaminated due to the entering of partial ions of the copper metal in the conductive body 121 into the first base 110 during ion diffusion, avoiding further affecting the performance of the entire semiconductor structure. The first metal protective layer 123 is used to protect the conductive body 121 from contacting with air, preventing a part of the conductive body 121 from being oxidized due to the reaction of the part of the conductive body 121 with air. The conductive body 121 can be separated from air by the first metal protective layer 123, thereby avoiding oxidation or water vapor corrosion of the conductive body 121, and the first metal protective layer 123 can also be configured to prevent the conductive body 121 from contaminating the second base 140 during ion diffusion.

Figure 2:
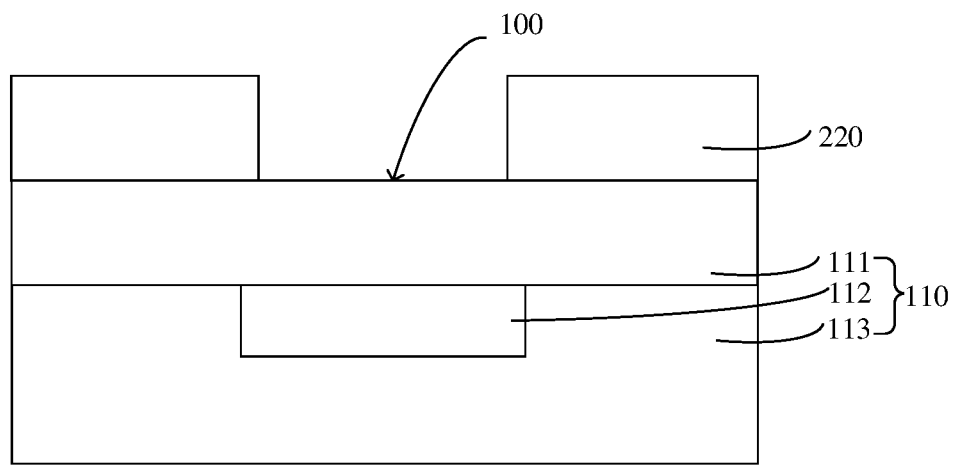
FIGS. 2 to 13 are schematic structural diagrams corresponding to each step of a method for preparing a semiconductor structure provided by an embodiment of the disclosure.
Figure 3:
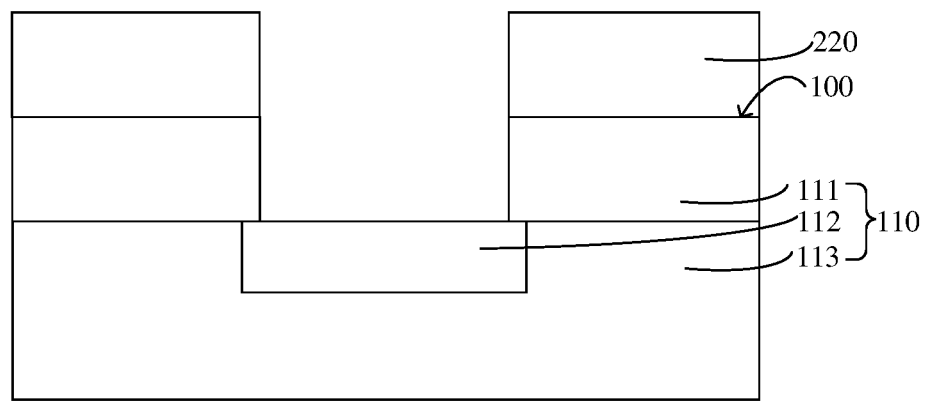

In some embodiments, before forming the first diffusion barrier layer 122, the following operations may also be included. Referring to FIG. 2, a mask layer 220 having a first pattern is formed on the surface of the first face of the first base 110. Referring to FIG. 3, the passivation layer 111 of the first base 110 is etched with the mask layer 220 as a mask, to form a groove.

In some embodiments, the first base 110 includes a substrate 113, a passivation layer 111 and a conductive layer 112. The groove of the passivation layer 111 exposes the top surface of the conductive layer 112. In other embodiments, during etching the passivation layer 111, a part of the conductive layer 112 is etched, that is, a part of the groove is also located in the conductive layer 112. In yet other embodiments, the groove may also penetrate the conductive layer.

In some embodiments, the method of etching the passivation layer 111 may be a dry etching. For example, plasma is guided to accelerate through an electric field to give it a certain energy, and the plasma is guided to bombard the passivation layer 111, thus forming a groove.

Figure 4:
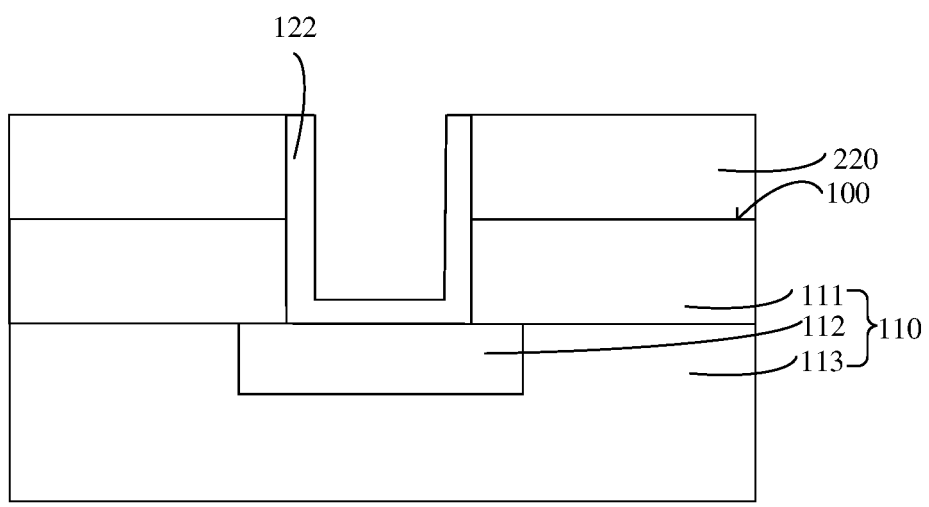

Referring to FIG. 4, the first diffusion barrier layer 122 is formed on the inner walls and the bottom surface of the groove.

In some embodiments, the first diffusion barrier layer 122 may be formed by PVD (Physical Vapor Deposition).

The process of forming the first diffusion barrier layer 122 may include the following operations. An initial barrier layer is formed on the surface of the mask layer 220 and on the inner walls and bottom surface of the groove. A pattern layer exposing an initial barrier layer located on the surface of the mask layer 220 is formed. The initial barrier layer on the surface of the mask layer 220 is removed by etching with the pattern layer as a mask, and the remaining initial barrier layer serves as the first diffusion barrier layer 122. The pattern layer is removed.

Figure 5:
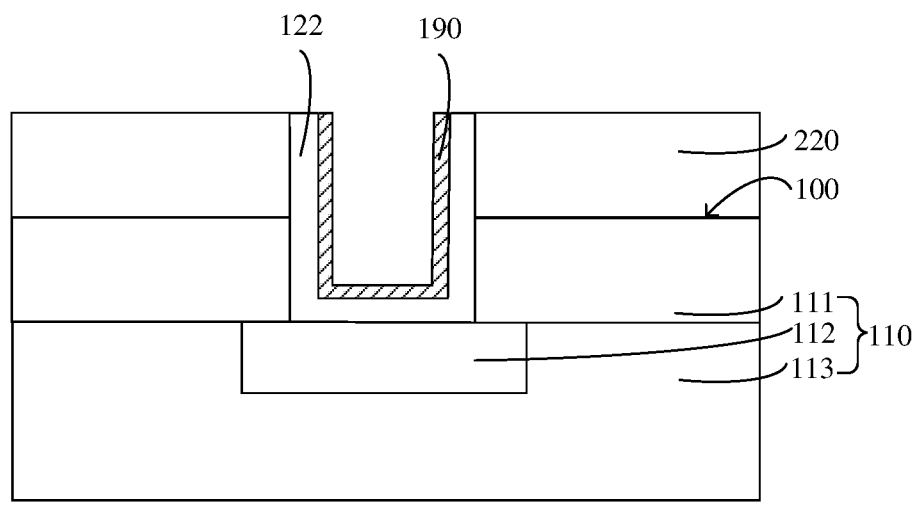

Referring to FIG. 5, the following operation may further be included. The first electroplating seed layer 190 is formed on the surface of the first diffusion barrier layer 122 before forming the conductive body 121.

In some embodiments, the first electroplating seed layer 190 is formed by a PVD process.

In some embodiments, the thickness of the first electroplating seed layer 190 may be 50 nm to 100 nm.

The material of the first electroplating seed layer 190 may be the same as that of the conductive body 121. The formation of the conductive body 121 can be promoted by forming the first electroplating seed layer 190 in advance, and the cavity defects in the conductive body 121 formed subsequently can also be reduced by the first electroplating seed layer 190. Therefore, the effect of the first diffusion barrier layer 122 in preventing ion diffusion of the conductive body 121 is improved, thereby improving the performance of the semiconductor structure. The adhesion between the conductive body 121 and the first diffusion barrier layer 122 can also be improved by the first electroplating seed layer 190, thereby improving the stability of the connection between the conductive body 121 and the first diffusion barrier layer 122.

Figure 6:
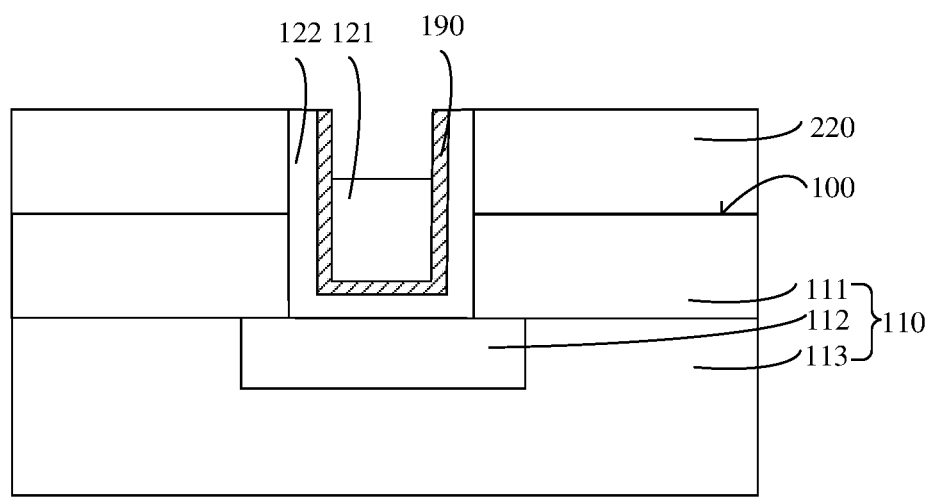

Referring to FIG. 6, the conductive body 121 filling the groove is formed on the first diffusion barrier layer 122.

In some embodiments, the conductive body 121 may be formed on the surface of the first electroplating seed layer 190 by an electroplating process.

In some embodiments, the conductive body 121 is higher than the passivation layer 111, and the thickness of the part of the conductive body 121 higher than the passivation layer 111 may be between 1/5 and 1/3 times the thickness of the mask layer 220.

It will be understood that the part of the conductive body 121 higher than the passivation layer 111 is the thickness of the electrical connection column embedded in the second base subsequently. When the thickness of the part of the conductive body 121 higher than the passivation layer 111 is less than 1/5 of the thickness of mask layer 220, the corresponding improvement effect is not good. When the thickness of the part of the conductive body 121 higher than the passivation layer 111 is greater than 1/3 of the thickness of mask layer 220, the conductive body 121 is prone to fracture when the mask layer 220 is subsequently removed, which is not conducive to improving the yield in the preparation process.

Figure 7:
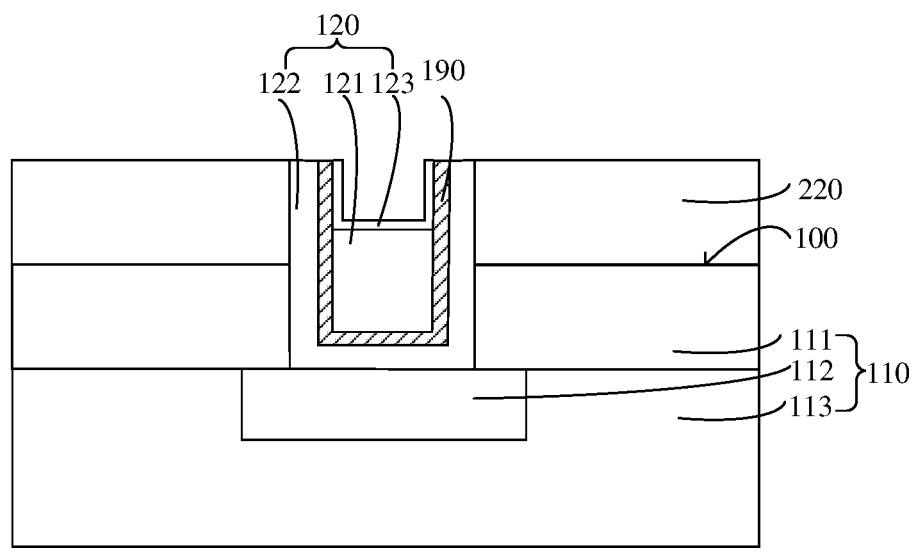

Referring to FIG. 7, a first metal protective layer 123 is formed on the top surface of the conductive body 121 and the side surfaces of the first electroplating seed layer 190 exposed from the conductive body 121.

In some embodiments, the first metal protective layer 123 may be flush with the top surface of the first diffusion barrier layer 122, and the thickness of the first metal protective layer 123 may be 5 nm to 50 nm.

It will be understood that, when the thickness of the first metal protective layer 123 is less than 5 nm, the effect of protecting the conductive body 121 is poor. When the thickness of the first metal protective layer 123 is greater than 50 nm, the volume of the subsequent formed initial welded structure is affected. The volume of the initial welded structure is related to a confined space defined by the first metal protective layer 123. The thicker the first metal protective layer 123 is, the smaller the confined space defined by the first metal protective layer 123 is accordingly, and thus the smaller the volume that can accommodate the initial welded structure is accordingly.

The thickness of the first metal protective layer 123 can be selected to be a corresponding thickness based on the actual situation.

Figure 8:
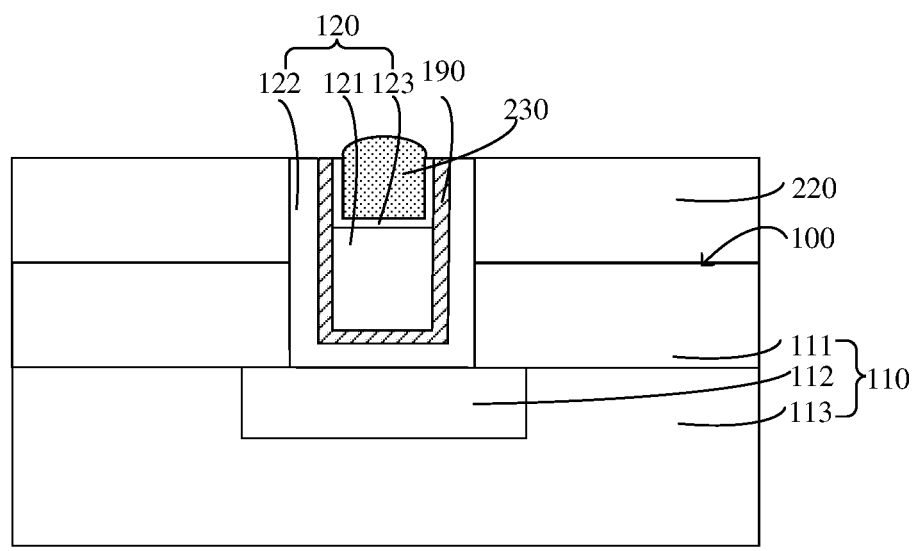

Referring to FIG. 8, in some embodiments, an initial welded structure 230 filling the remaining groove is also formed after the first metal protective layer 123 is formed.

The initial welded structure 230 provides a process basis for the subsequent connection of the conductive column 150 and the electrical connection column 120.

In some embodiments, the material of the initial welded structure 230 may be tin or tin-silver alloy. The tin or tin-silver alloy has a lower melting point and condensation point, thereby forming the initial welded structure 230 at a faster speed. The confined space formed by the first metal protective layer 123 can also limit the shape of the initial welded structure 230, and prevent the initial welded structure 230 in a molten state from flowing around in the process of forming the initial welded structure 230. Thus, the probability of the electrical connection between adjacent conductive columns 150 or adjacent electrical connection columns 120 due to the flow of the initial welded structure 230 in the semiconductor structure can be reduced, thereby reducing the risk of short circuit of the semiconductor structure.

In some embodiments, the initial welded structure 230 in the molten state can be filled into the remaining space of the groove, and the initial welded structure 230 can be turned into a solid state by condensation after the filling is completed.

In some embodiments, the top surface of the initial welded structure 230 may be higher than the top surface of the first metal protective layer 123. It is understood that the subsequent initial welded structure 230 needs to fill up the remaining spaces of the first groove and the second groove, so the volume of the initial welded structure 230 needs to be larger than the volume of the remaining spaces of the grooves.

It will be understood that the part of the initial welded structure 230 higher than the top surface of the first metal protective layer 123 has an arc shape due to the presence of liquid surface tension, and it is relatively easy to form the top surface of the initial welded structure 230 to be higher than the top surface of the first metal protective layer 123, since the initial welded structure 230 has a high condensation point, and thus the initial welded structure 230 is easy to solidify and shape.

Figure 9:
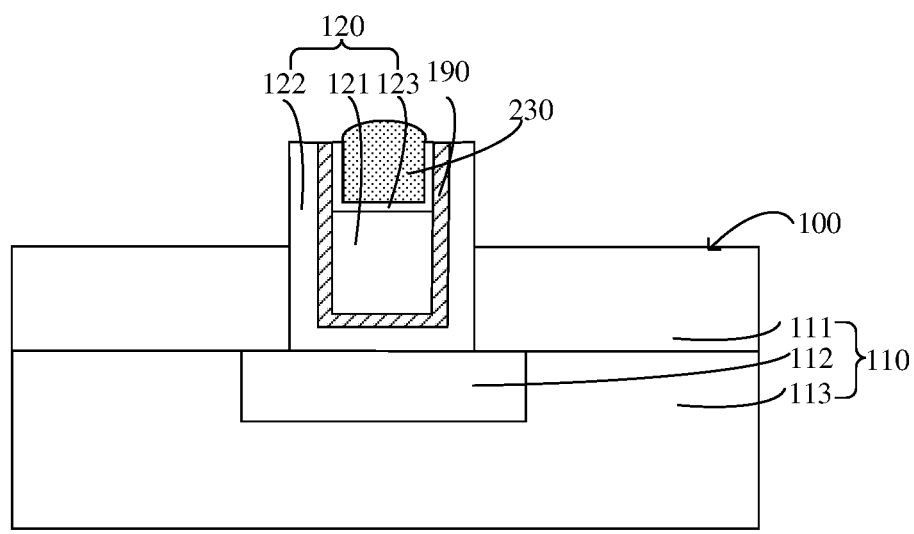

Referring to FIG. 9, the following operation is further included. After forming the initial welded structure 230, the mask layer 220 (refer to FIG. 8) is removed.

Figure 10:
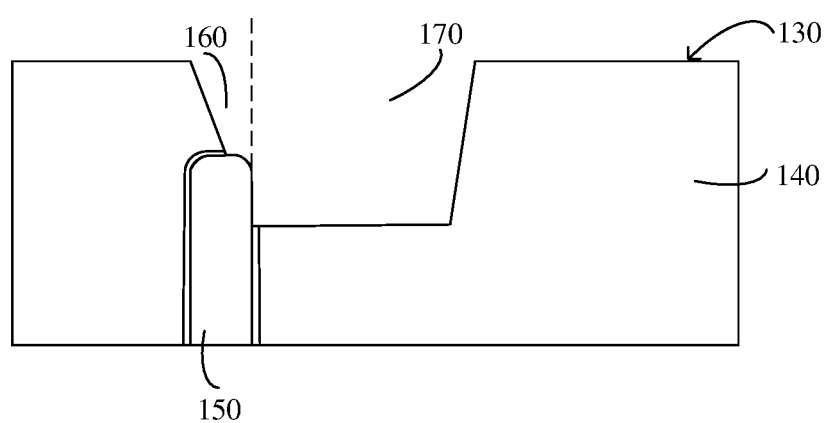

Referring to FIG. 10, a second base 140 having a second face 130 is provided. A conductive column 150 is provided in second base 140. A first groove 160 and a second groove 170 are further provided at the second face 130. The first groove 160 communicates with the second groove 170. The first groove 160 is located above the conductive column 150 and exposes at least a part of a top surface of the conductive column 150, and the second groove 170 exposes at least a part of a side surface of the conductive column 150.

The material of the second base 140 may be silicon, germanium, silicon carbide, silicon germanium, gallium arsenide or indium gallium and the like.

In some embodiments, a silicon oxide layer is further included on the surface of the conductive column 150, and the process of forming by etching the first groove 160 and the second groove 170 further includes removing the silicon oxide layer on the surface of the conductive column 150 exposed by the first groove 160 and the second groove 170.

In some embodiments, the sum of the widths of the first groove 160 and the second groove 170 formed is 2 to 3 times the width of the conductive column 150, in the direction perpendicular to the extension direction of the conductive column 150.

It will be understood that, by setting the sum of the widths of the first groove 160 and the second groove 170 to be 2 to 3 times the width of the conductive column 150, it is beneficial to fill the unoccupied space in the first groove 160 and the second groove 170 by the conductive column 150 and the electrical connection column 120. It will be understood that the ratio of the widths of the first groove 160 and the second groove 170 to the width of the conductive columns 150 can be accordingly adjusted based on the total volume of the conductive column 150 and the electrical connection column 120 to be accommodated by the first groove 160 and the second groove 170.

In some embodiments, the ratio of the depth of the first groove 160 to the depth of the second groove 170 formed is in the range of 1:1 to 1:10, for example, 1:3, 1:5, 1:8 and the like, in the direction perpendicular to the first face 100.

It will be understood that the ratio of the depth of the first groove 160 to the depth of the second groove 170 can be adjusted based on actual needs. The sum of the depths of the first groove 160 and the second groove 170 should satisfy that the welded structure 180 needs to fill up the first groove 160 and the second groove 170 after bonding the first base 110 to the second base 140. On the premise that the welded structure 180 fills up the first groove 160 and the second groove, the deeper the second groove 170 is, the larger the contact area between the electrical connection column 120 and the conductive column 150 is accordingly, and the larger the contact area is, the better the heat dissipation effect of the semiconductor structure is. When the ratio of the depth of the first groove 160 to the depth of the second groove 170 is less than 1:10, it may occur that the welded structure 180 cannot fill up the entire first groove 160 and the second groove 170, resulting in a low stability of the semiconductor structure.

Figure 11:
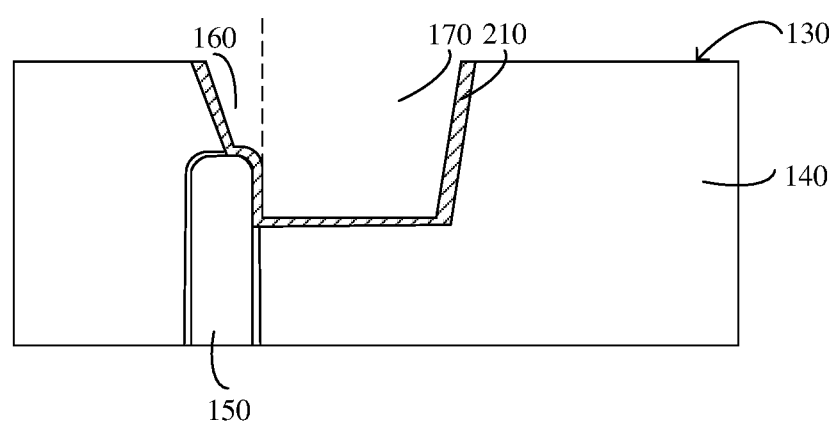

Referring to FIG. 11, in some embodiments, the method for preparing a semiconductor structure further includes forming a second electroplating seed layer 210 on the bottom surfaces and sidewalls of the first groove 160 and the second groove 170.

In some embodiments, a corresponding layer of material is deposited by PVD on the bottom surfaces and sidewalls of the first groove 160 and the second groove 170, so as to form the second electroplating seed layer 210. By the second electroplating seed layer 210, the adhesion between the conductive column 150 and the subsequently formed second diffusion barrier layer can be improved, and thus the stability of the connection between the conductive column 150 and the second diffusion barrier layer is improved. Furthermore, the effect of the second diffusion barrier layer in preventing ion diffusion of the conductive column 150 can be improved by the laminated structure of the second electroplating seed layer 210 and the second diffusion barrier layer.

Figure 12:
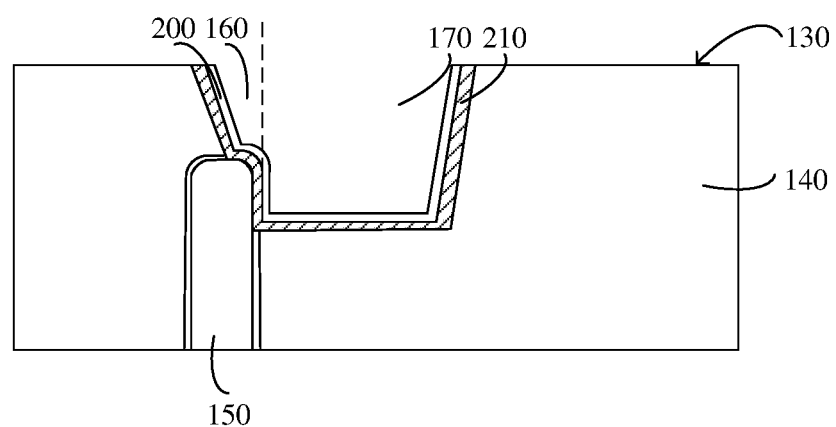

Referring to FIG. 12, the following operation may further be included. Before bonding the second face 130 to the first Face 100, a second diffusion barrier layer 200 is formed. The second diffusion barrier layer 200 is located on the bottom surface and sidewall of the first groove 160, and also on the top surface of the conductive column 150 exposed by the first groove 160 and the side surface of the conductive column 150 exposed by the second groove 170.

In some embodiments, A second diffusion barrier layer 200 may be formed on the surface of the second electroplating seed layer 210 by electroplating. In other embodiments, the second diffusion barrier layer 200 may be formed in a PVD manner. The second initial barrier layer may be formed on the surface of the second base 140, the sidewalls and bottom surfaces of the first groove 160 and the second groove 170. A second pattern layer exposing the second initial barrier layer located on the surface of the second base 140 is formed. The second initial barrier layer on the surface of the second base 140 is removed by etching with the second pattern layer as a mask, and the remaining second initial barrier layer serves as the second diffusion barrier layer 200. The second pattern layer is removed.

The second diffusion barrier layer 200 can prevent part of ions of the material of the conductive column 150 from entering the first base 110 during ion diffusion, reducing the possibility of contamination of the first base 110, thereby avoiding affecting the performance of the entire semiconductor structure. By providing the second diffusion barrier layer 200, the grain boundaries and various defects of a part of the conductive column 150 can be filled, thereby blocking the rapid diffusion path of atoms.

Figure 13:
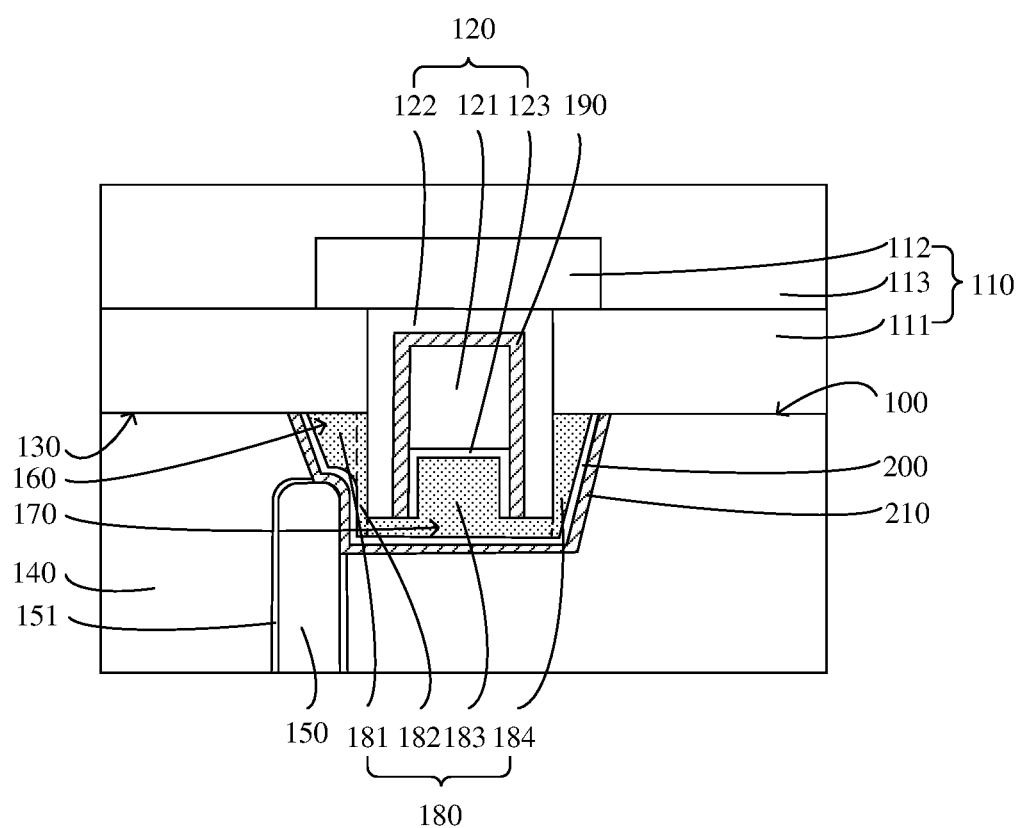

Referring to FIG. 13, the second face 130 is bonded to the first face 100. The protruding portion of the electrical connection column 120 is located in the second groove 170, and a part of the side surface of the electrical connection column 120 and a part of the side surface of the conductive column 150 are overlapped in a staggered way in the direction perpendicular to the first face 100 or the second face 130. A welded structure 180 is formed. At least a part of the welded structure 180 is filled in the first groove 160, and at least a further part of the welded structure 180 is also located between the electrical connection column 120 and the bottom surface of the second groove 170.

Specifically, the first face 100 of the first base 110 and the second face 130 of the second base 140 are bonded The initial welded structure 230 (refer to FIG. 9) is annealed during bonding the second face 130 to the first face 100, to form the welded structure 180. It will be understood that, during bonding the second face 130 to the first face 100, the initial welded structure 230 is heated into a molten state. As the surface of the second face 130 is attached to the surface of the first face 100, the initial welded structure 230 (refer to FIG. 9) in the molten state is confined by the first groove 160 and the second groove 170 and pressed by the electrical connection column 120, and moves in a direction away from the electrical connection column 120. After the bonding of the second face 130 to the first face 100 is completed, the initial welded structure 230 in the molten state (refer to FIG. 9) is condensed into the welded structure 180 by annealing the semiconductor structure.

The electrical connection between the conductive column 150 and the electrical connection column 120 can be realized by the welded structure 180, and the connection between the first base 110 and the second base 140 can be reinforced by the welded structure 180, thereby improving the stability of the semiconductor structure.

The disclosure provides a method for preparing a semiconductor structure. By bonding the first face 100 of the first base 110 to the second face 130 of the second base 140, and by arranging the protruding portion of the electrical connection column 120 in the second groove 170, the risk that the electrical connection of adjacent electrical connection columns 120 or conductive columns 150 results in short circuit of the entire semiconductor structure can be reduced while reducing the height of the formed semiconductor structure. The widths of the electrical connection column 120, the conductive column 150, the first groove 160 and the second groove 170 can be correspondingly increased by arranging the protruding portion of the electrical connection column 120 in the second groove 170, increasing the contact area between the electrical connection column 120 and the conductive column 150, so that the contact resistance between the electrical connection column 120 and the conductive column 150 can be reduced. Moreover, the heat dissipation area of the electrical connection column 120 and the conductive column 150 can be increased by arranging the protruding portion of the electrical connection column 120 in the second groove 170, thereby improving the performance of the semiconductor structure.

Those of ordinary skill in the art will appreciate that the above-described implementation modes are specific embodiments for implementing the disclosure, while in practical application, various changes in form and detail may be made thereto without departing from the spirit and scope of the disclosure. Any person skilled in the art may make their own changes and modifications without departing from the spirit and scope of the disclosure, so the scope of protection of the disclosure shall be subject to the scope defined by the claims.

The invention claimed is:

1. A semiconductor structure, comprising:
a first base having a first face, wherein the first base is provided with an electrical connection column protruding from the first face;
a second base having a second face, wherein a conductive column is provided in the second base, and a first groove and a second groove are further provided at the second face, wherein the first groove communicates with the second groove, the first groove is located above the conductive column and exposes at least a part of a top surface of the conductive column, and the second groove exposes at least a part of a side surface of the conductive column;
the second face is bonded to the first face, a protruding portion of the electrical connection column is located in the second groove, and a part of a side surface of the electrical connection column and a part of the side surface of the conductive column overlap in a staggered way in a direction perpendicular to the first face or the second face; and
a welded structure, wherein at least a part of the welded structure is filled in the first groove, and at least a further part of the welded structure is located between the electrical connection column and a bottom surface of the second groove.

2. A method for preparing a semiconductor structure, comprising:
providing a first base having a first face, wherein the first base is provided with an electrical connection column protruding from the first face;
providing a second base having a second face, wherein a conductive column is provided in the second base, and a first groove and a second groove are further provided at the second face, wherein the first groove communicates with the second groove, the first groove is located above the conductive column and exposes at least a part of a top surface of the conductive column, and the second groove exposes at least a part of a side surface of the conductive column;
bonding the second face to the first face, wherein a protruding portion of the electrical connection column is located in the second groove, and a part of a side surface of the electrical connection column and a part of the side surface of the conductive column overlap in a staggered way in a direction perpendicular to the first face or the second face; and
forming a welded structure, wherein at least a part of the welded structure is filled in the first groove, and at least a further part of the welded structure is located between the electrical connection column and a bottom surface of the second groove.

3. The semiconductor structure according to claim 1, wherein a ratio of a depth of the first groove to a depth of the second groove is in a range of 1:1 to 1:10, in the direction perpendicular to the first face.

4. The semiconductor structure according to claim 1, wherein the welded structure is further located between the electrical connection column and sidewalls of the second groove and between the conductive column and the electrical connection column.

5. The semiconductor structure according to claim 1, wherein a material of the welded structure comprises tin, tin-silver alloy, or the like.

6. The semiconductor structure according to claim 1, wherein a sum of widths of the first groove and the second groove is 2 to 3 times a width of the conductive column in a direction perpendicular to an extension direction of the conductive column.

7. The method for preparing a semiconductor structure according to claim 2, wherein forming the electrical connection column comprises:
forming a first diffusion barrier layer; and
forming a conductive body and a first metal protective layer located on a top surface of the conductive body, wherein the first metal protective layer is also located between the conductive body and the welded structure, and the first diffusion barrier layer is located at least on side surfaces and a bottom surface of the conductive body.

8. The method for preparing a semiconductor structure according to claim 2, wherein a sum of widths of the first groove and the second groove formed is 2 to 3 times a width of the conductive column, in a direction perpendicular to an extension direction of the conductive column.

9. The method for preparing a semiconductor structure according to claim 2, wherein a ratio of a depth of the first groove to a depth of the second groove formed is in a range of 1:1 to 1:10, in the direction perpendicular to the first face.

10. The method for preparing a semiconductor structure according to claim 2, further comprising: before bonding the second face to the first face, forming a second diffusion barrier layer, wherein the second diffusion barrier layer is located on a bottom surface and a sidewall of the first groove, and is also located on the top surface of the conductive column exposed by the first groove and the side surface of the conductive column exposed by the second groove.

11. The method for preparing a semiconductor structure according to claim 2, wherein forming the welded structure comprises: forming an initial welded structure located on a top surface of the electrical connection column; and
annealing the initial welded structure during bonding the second face to the first face to form the welded structure.

12. The semiconductor structure according to claim 1, further comprising a second diffusion barrier layer located on a bottom surface and a sidewall of the first groove, and also located on the bottom surface and a sidewall of the second groove, as well as located on the top surface of the conductive column exposed by the first groove and the side surface of the conductive column exposed by the second groove.

13. The semiconductor structure according to claim 12, further comprising: a second electroplating seed layer located between the second diffusion barrier layer and the bottom surface, the sidewall of the first groove, and also located between the second diffusion barrier layer and the bottom surface, the sidewall of the second groove, as well as between the second diffusion barrier layer and the top surface of the conductive column exposed by the first groove, and between the second diffusion barrier layer and the side surface of the conductive column exposed by the second groove.

14. The semiconductor structure according to claim 1, wherein, the electrical connection column comprises: a conductive body, a first diffusion barrier layer located on a bottom surface and side surfaces of the conductive body, and a first metal protective layer located on a top surface of the conductive body, wherein the first metal protective layer is located between the conductive body and the welded structure, and a part of the conductive body is located in the second groove.

15. The semiconductor structure according to claim 14, wherein a material of the conductive body comprises copper or aluminum, and a material of the first diffusion barrier layer comprises tantalum, titanium, titanium nitride or tantalum nitride.

16. The semiconductor structure according to claim 14, wherein the first diffusion barrier layer and the first metal protective layer further have portions protruding from the top surface of the conductive body.

17. The semiconductor structure according to claim 16, wherein the semiconductor structure further comprises a first electroplating seed layer located between the conductive body and the first diffusion barrier layer.

\* \* \* \* \*